United States Patent [19]

Takai

[11] Patent Number: 5,608,686
[45] Date of Patent: Mar. 4, 1997

[54] SYNCHRONOUS SEMICONDUCTOR MEMORY DEVICE WITH LOW POWER CONSUMPTION

[75] Inventor: Yasuhiro Takai, Tokyo, Japan

[73] Assignee: NEC Corporation, Tokyo, Japan

[21] Appl. No.: 512,420

[22] Filed: Aug. 8, 1995

[30] Foreign Application Priority Data

Aug. 12, 1994 [JP] Japan .................................. 6-212082

[51] Int. Cl.$^6$ ..................................................... G11C 8/00
[52] U.S. Cl. ............... 365/233; 395/497.01; 395/497.04; 395/494; 395/432; 395/467
[58] Field of Search ............................................. 365/233

[56] References Cited

U.S. PATENT DOCUMENTS 5,546,346 8/1996 Abata et al. ............................ 365/233
5,550,784 8/1996 Takai ...................................... 365/233

Primary Examiner—Joseph E. Clawson, Jr.
Attorney, Agent, or Firm—Sughrue, Mion, Zinn, Macpeak & Seas

[57] ABSTRACT

A synchronous semiconductor memory device has an M-bit I/O configuration memory device mode and an M×2$^k$-bit I/O configuration memory device mode. In the former mode, n bits whose transition frequencies are smaller are selected from an m-bit internal address and are used to access a memory section, while the other k (=m−n) bits whose transition frequencies are larger are selected from the m-bit internal address to select one of 2$^k$ groups of internal data lines of the memory section and connect them to some of data input/output pins. In the latter mode, n bits whose transition frequencies are larger are selected from the m-bit internal address and are used to access the memory section, while the 2$^k$ groups of the data lines are connected to all the data input/output pins.

13 Claims, 16 Drawing Sheets

SYNCHRONOUS SEMICONDUCTOR MEMORY DEVICE WITH LOW POWER CONSUMPTION

BACKGROUND OF THE INVENTION

1. Field of the Invention

The present invention relates to a semiconductor memory device, and more particularly, to a synchronous semiconductor memory device where a plurality of input/output (I/O) bit configurations are manufactured on one chip and one of the I/O bit configurations is selected and fixed by a mode setting circuit determined at a wiring step or a similar manufacturing step.

2. Description of the Related Art

Recently, as the operation speed of microprocessors has increased, high speed access is also required for a main memory which is Generally constructed by a dynamic random access memory (DRAM) device, for example. In order to satisfy this requirement, synchronous semiconductor memory devices have been developed.

In a synchronous semiconductor memory device, when an external address as well as a data read/write command is supplied thereto, the external address is latched in a burst counter, so that a read/write operation is performed upon a memory section using this external address in the burst counter. Then, the content of the burst counter is incremented or decremented by receiving a synchronization clock signal, so that sequential read/write operations are performed upon the memory section using incremented or decremented addresses in the burst counter. Thus, in a synchronous semiconductor memory device, internal addresses are automatically generated inside of the device after an external address with a read/write command is received, and read/write operations are successively carried out by using the internal addresses, to thereby realize a high speed read/write operation based upon a burst operation.

On the other hand, two kinds of semiconductor memory devices such as a 4-bit I/O configuration memory device and an 8-bit I/O configuration memory device are manufactured on one chip, and one of the memory devices is selected and fixed at a final stage such as a wiring step or a bonding step. That is, when such two kinds of memory devices are manufactured, most circuitry layouts thereof are commonly designed, to reduce the design cost. Also, the mode setting or fixing of the two memory devices is carried out at a later stage of the manufacturing steps, to rapidly comply with customers' orders.

In a prior art synchronous semiconductor memory device in which two kinds of semiconductor devices such as an M-bit I/O configuration memory device and an M×$2^k$-bit I/O configuration are manufactured on one chip, and one of the semiconductor devices is selected to be fixed at a later stage of the manufacturing steps, m-bit (m>k) internal addresses are successively generated, and lower n bits (n=m–k) of the m-bit internal addresses are used to access a memory section both in an M-bit I/O configuration memory device mode and in an M×$2^k$-bit I/O configuration memory device mode. Then, only in the M-bit I/O configuration memory device mode, the other k bits of the m-bit internal addresses are used to select one of $2^k$ groups of data lines of the memory section and connect them to some of data input/output pins. Conversely, in the M×$2^k$-bit I/O configuration memory device mode, all the data lines of the memory section are connected to all the data input/output pins regardless of the other k bits of the m-bit internal addresses. This will be explained later in detail.

In the above-described prior art synchronous DRAM device, however, since the same lower n bits of the m-bit internal addresses are used to access the memory section in the M-bit I/O configuration memory device mode and in the M×$2^k$-bit I/O configuration memory device mode, the frequency of transition of the lower n bits of the m-bit internal addresses is so large as to increase the power consumption in decoders, amplifiers and the like of the memory section in the M-bit I/O configuration memory device mode. This also will be explained later in detail.

SUMMARY OF THE INVENTION

It is an object of the present invention to reduce the power consumption in a synchronous semiconductor memory device in which two or more kinds of I/O configuration semiconductor devices are manufactured on one chip, and one of the semiconductor devices is selected and fixed at a later stage of the manufacturing steps.

According to the present invention, in the M-bit I/O configuration memory device mode, n bits whose transition frequencies are smaller are selected from the m-bit internal adresses and are used to access the memory section, while the other k (k=m–n) bits whose transition frequencies are larger are selected from the m-bit internal adresses to select one of the $2^k$ groups of the internal data lines and connect them to some of the data input/output pins. Contrary to this, in the M×$2^k$-bit I/O configuration memory device mode, n bits whose transition frequencies are larger are slected from the m-bit internal addresses and are used to access the memory section, while the $2^k$ groups of the data lines are connected to all the data input/output pins.

Thus, since the n bits of the m-bit internal addresses for accessing the memory section in the M-bit I/O configuration memory device mode have small transition frequencies, the power consumption in decoders, amplifiers and the like of the memory section is reduced to reduce the power consumption in the device.

BRIEF DESCRIPTION OF THE DRAWINGS

The present invention will be more clearly understood from the description as set forth below, as compared with the prior art, with reference to the accompanying drawings, wherein:

Figure 2:
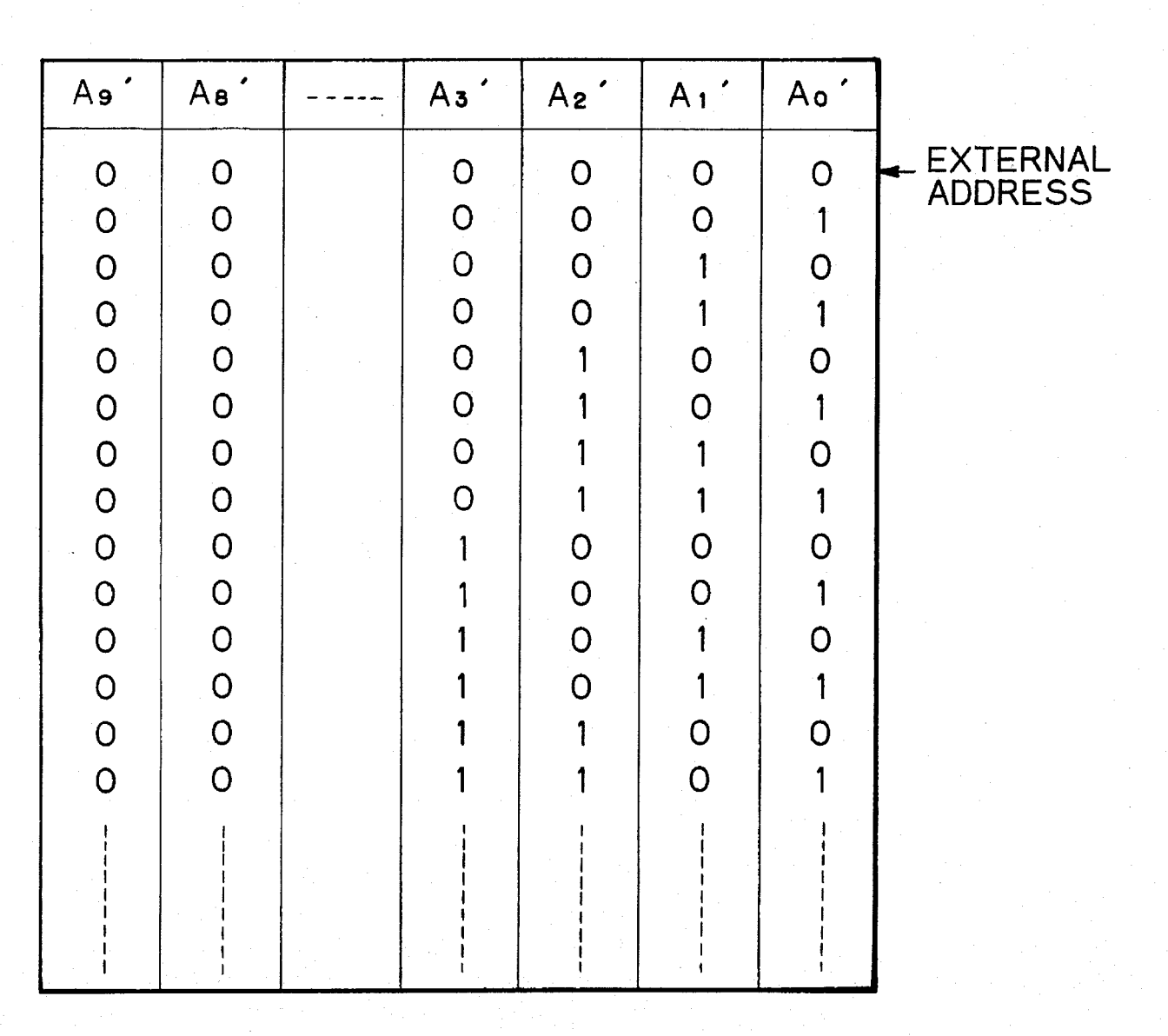

FIG. 2 is a table showing examples of the internal accresses of the device of FIG. 1;

FIG. 12 is a table showing examples of the internal addresses of the burst counter of FIG. 11;

FIG. 14 is a table showing examples of the internal addresses of the burst counter of FIG. 13;

DESCRIPTION OF THE PREFERRED EMBODIMENTS

Before the description of the preferred embodiments, a prior art synchronous semiconductor memory device will be explained with reference to FIGS. 1 and 2.

Figure 1:
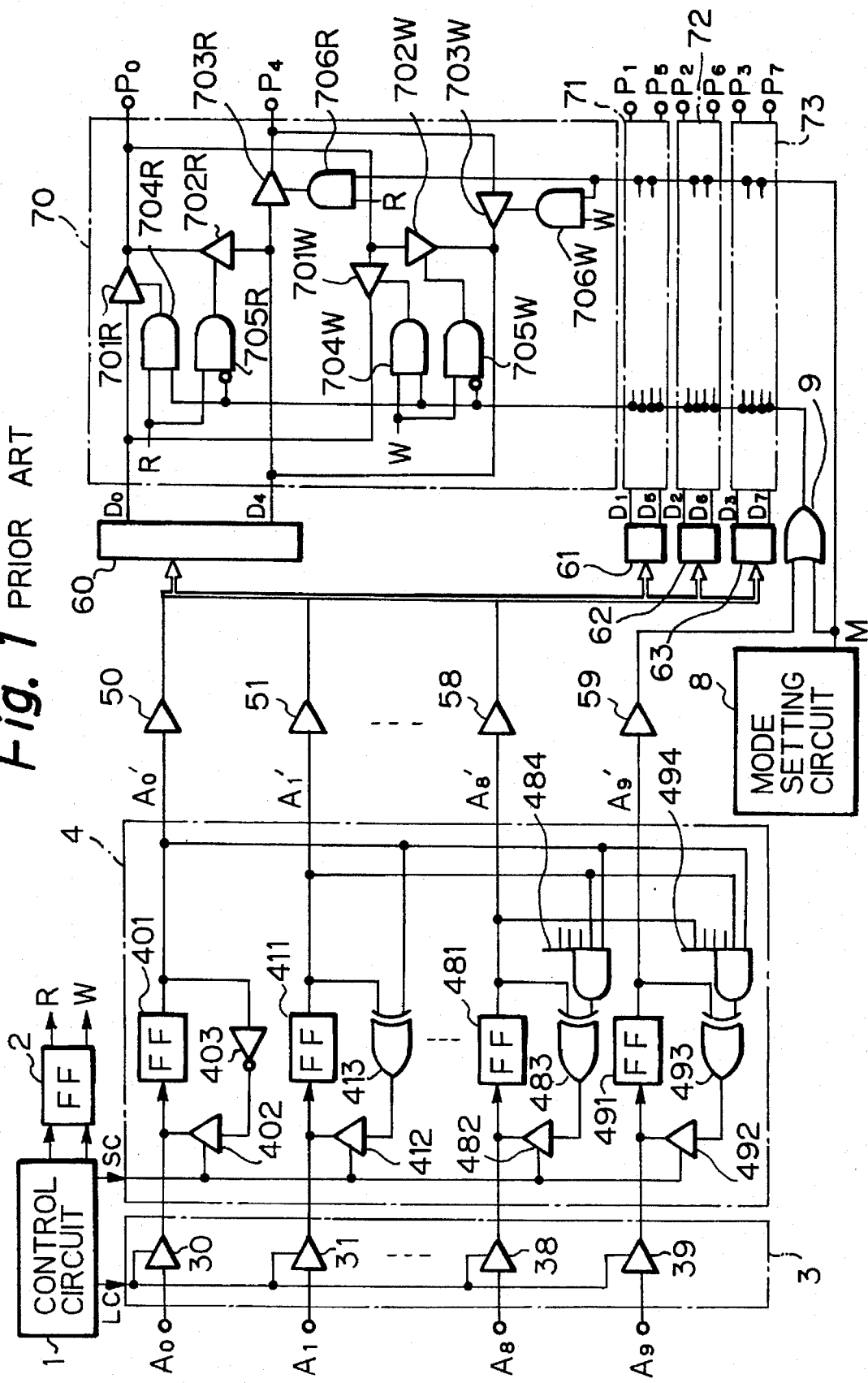
FIG. 1 is a circuit diagram illustrating a prior art synchronous semiconductor memory device.

In FIG. 1, a 4-bit I/O configuration memory device and an 8-bit I/O configuration memory device are manufactured on one chip, and one of the devices is selected and fixed at a wiring step or the like.

Reference numeral 1 designates a control circuit for generating a latch clock signal LC, a synchronization clock signal SC, and the like. Also, the control circuit 1 controls a flip-flop 2. That is, in a read mode, the flip-flop 2 is set, so that a read signal R is made high (="1") and a write signal W is made low (="0"). Contrary to this, in a write mode, the flip-flop 2 is reset, so that the read signal R is made low (="0") and a write signal W is made high (="1").

A latch circuit 3 recieves the latch control signal LC to latch a 10-bit external address designated by $A_0, A_1, \ldots, A_8$ and $A_9$. The latch circuit is constructed by tri-state buffers 30, 31, . . . 38 and 39. The external address latched by the latch circuit 3 is supplied to a burst counter 4.

The burst counter 4 is constructed by a flip-flop 401, a tri-state buffer 402 and an inverter 403 for the external address bit $A_0$; a flip-flop 411, a tri-state buffer 412 and an inverter 413 for the external address bit $A_1$; . . . ; a flip-flop 481, a tri-state buffer 482, an exclusive OR circuit 483 and an AND circuit 484 for the external address bit $A_8$; and a flip-flop 491, a tri-state buffer 492, an exclusive OR circuit 493 and an AND circuit 494 for the external address bit $A_9$. As a result, every time the burst counter 4 receives the synchronization clock signal SC, the content of the burst counter 4 is counted up by +1, to generate a 9-bit internal address designated by $A_0', A_1', \ldots, A_8'$ and $A_9'$ as shown in FIG. 2. In FIG. 2, note that the external address $(A_0, A_1, \ldots, A_8, A_9) = (A_0', A_1', \ldots, A_8', A_9')$ is 0000000000.

The internal address bits $A_0', A_1', \ldots, A_8', A_9'$ are supplied to buffers 50, 51, . . . , 58 and 59, respectively. The lower nine bits $A_0', A_1', \ldots, A_8'$ of the internal address are supplied to four memory blocks 60, 61, 62 and 63 which have the same configuration.

Each of the memory blocks 60, 61, 62 and 63 decodes the 9 bits $A_0', A_1', \ldots, A_8'$ of the internal address. As a result, in a read mode (R="1"), two memory cell data an each memory block 60 (61, 62, 63) are amplified and are output to internal data lines $D_0$ and $D_4$ ($D_1, D_5$; $D_2, D_6$; and $D_3, D_7$). Contrary to this, in a write mode (W="1"), data on the internal data lines $D_0$ and $D_4$ ($D_1, D_5$; $D_2, D_6$; and $D_3, D_7$) are written into two memory cells of each of the memory blocks 60, 61, 62 and 63.

The internal data lines $D_0, D_4, D_1, D_5, D_2, D_6, D_3$ and $D_7$ correspond to data input/output pins $P_0, P_4, P_1, P_5, P_2, P_6, P_3$ and $P_7$, respectively. Also, input/output (I/O) selection circuits 70, 71, 72, and 73 are provided between the internal data lines $D_0, D_4, D_1, D_5, D_2, D_6, D_3$ and $D_7$ and the data I/O pins $P_0, P_4, P_1, P_5, P_2, P_6, P_3$ and $P_7$. That is, in a 4-bit I/O configuration memory device mode, only the data input/output pins $P_0$ and $P_3$ are made effective. Therefore, in this case, the I/O selection circuits 70 to 73 are activated, so that either the internal data lines $D_0$ to $D_3$ or the internal data lines $D_4$ to $D_7$ are selected and are connected to the data input/output pins $P_0$ to $P_3$. On the other hand, in an 8-bit I/O configuration memory device mode, all the data input/output pins $P_0$ to $P_7$ are made effective. Therefore, in this case, the I/O selection circuits 70 to 73 are deactivated, i.e., the I/O selection circuits 70 to 73 are in a through state, so that the internal data lines $D_0$ to $D_7$ are connected to the data input/output pins $P_0$ to $P_7$, respectively.

The I/O selection circuit 70 is constructed by tri-state buffers 701R, 702R and 703R operated in a read mode (R="1"), gate circuits 784R, 705R and 706R operated by the read signal R, tri-state buffers 701W, 702W, and 703W operated in a write mode (W="1"), and gate circuits 704W, 705W and 706W operated by the write signal W. Note that the I/O selection circuits 71, 72 and 73 have the same configuration as the I/O selection circuit 70.

The I/O selection circuits 70, 71, 72 and 73 are controlled by a mode signal M of a mode setting circuit 8 and the most significant bit $A_9'$ of the internal address in addition to the read signal R and the write signal W. That is, the mode signal M is supplied to the gate circuits 706R and 706W. Also, the most significant bit $A_9'$ is supplied via an OR circuit 9 to the gate circuits 704R, 705R, 704W and 705W.

In a 4-bit I/O configuration memory device mode, the mode setting circuit 8 causes the mode signal M to be "0". As a result, the outputs of the gate circuits 706R and 706W of the I/O selection circuits 70 to 73 become "0", so that the tri-state buffers 703R and 703W are deactivated, while either the internal data lines $D_0$ to $D_3$ or the internal data lines $D_4$ to $D_7$ are selected and are connected to a special group of the data input/output pins such as $P_0$ to $P_3$. In this case, the most significant bit $A_9'$ is supplied via the OR circuit 9 to the gate circuits 704R, 705R, 704W and 705W. For example, if $A^{9'}$="1", the tri-state buffer 701R or 701W is activated, so that the internal data lines $D_0$ to $D_3$ are connected to the data input/output pins $P_0$ to $P_3$, respectively. On the other hand, if $A_9'$="0", the tri-state buffer 702R or 702W is activated, so that the internal data lines $D_4$ to $D_7$ are connected to the data input/output pins $P_0$ to $P_3$, respectively. Thus, the I/O selection circuits 70 to 73 are placed in an activated state, i.e., in a selection state by the most significant bit $A_9'$.

In an 8-bit I/O configuration memory device mode, the mode setting circuit 8 causes the mode signal M to be "1". As a result, the output of the OR circuit 9 becomes "1" regardless of the most significant bit $A_9'$, so that the gate circuits 704R or 704W of the I/O selection circuits 70 to 73 are activated, thus connecting the internal data lines $D_0$ to $D_3$ to the data input/output pins $P_0$ to $P_3$, respectively. Simultaneously, the outputs of the gate circuits 706R and 706W of the I/O selection circuits 70 to 73 become "1", so that the tri-state buffers 703R and 703W are activated, thus connecting the internal data lines $D_4$ to $D_7$ to the data input/output pins $P_4$ to $P_7$. Thus, the I/O selection circuits 70 to 71 are a in deactivated state, i.e., in a nonselection state by the most significant bit $A_9'$, so that the internal data lines $D_0$ to $D_7$ are connected to the data input output pins $P_0$ to $P_7$, respectively.

In the device of FIG. 1, however, since the leust significant bit $A_0'$ of the internal address which has a large transition frequency is used to access the memory section formed by the memory blocks 60, 61, 62 and 63, the power consumption in the decoders, the amplifiers and the like thereof is increased.

Figure 3:
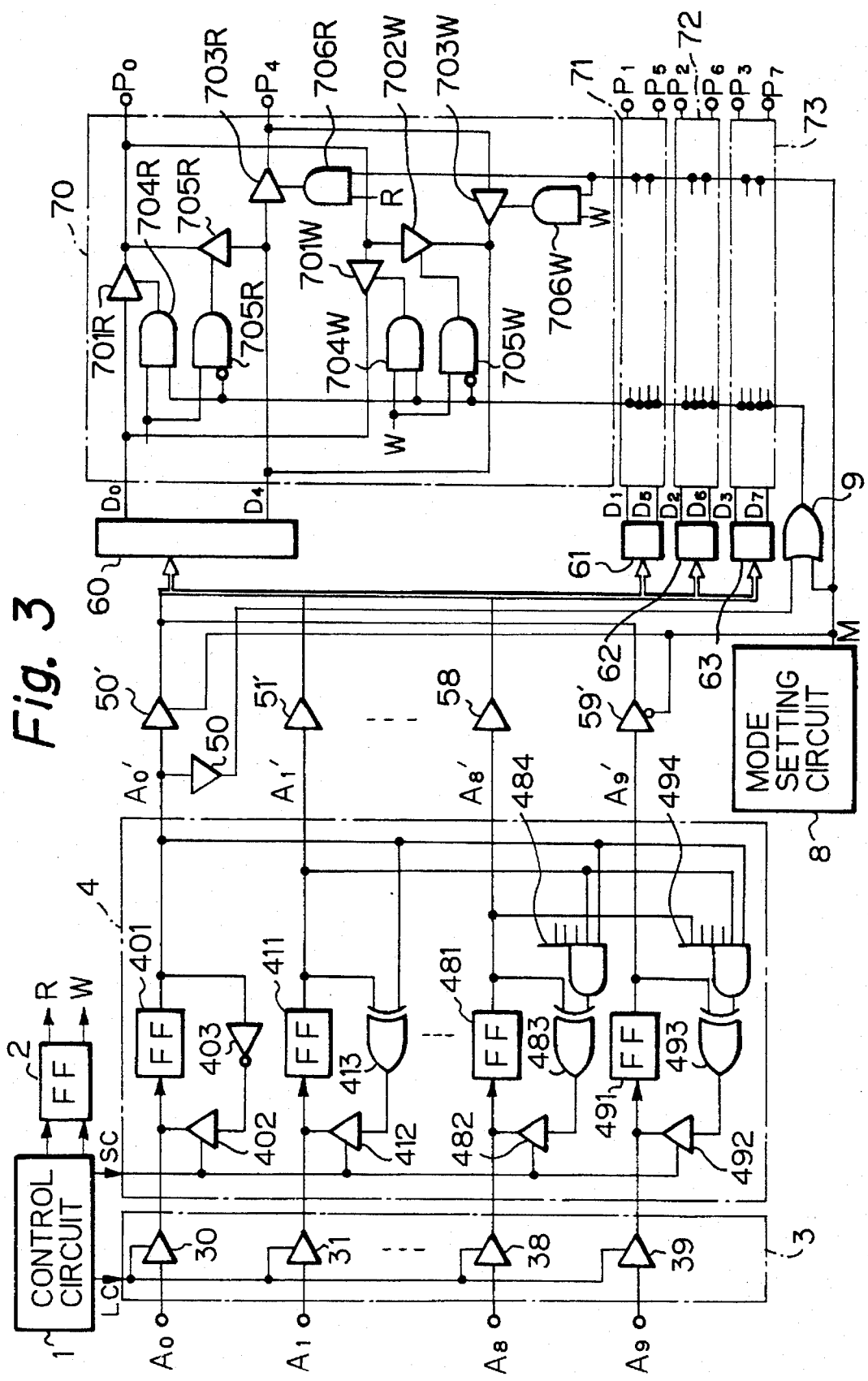
FIG. 3 is a circuit diagram illustrating a first embodiment of the synchroous semiconductor memory device according to the present invention.

In FIG. 3, which illustrates a first embodiment of the present invention, the buffer 50 instead of the buffer 59 of FIG. 1 is connected to the OR circuit 9, in order to supply the least significant bit $A_0'$ to the I/O selection circuits 70 to 73 in a 4-bit I/O configuration memory device mode. Also, a tri-state buffer 59' is provided instead of the buffer 59 of FIG. 1 and is connected to the least significant bit sides of the memory blocks 60 to 63, in order to supply the most significant bit $A_9'$ to the memory bolcks 60 to 63 in a 4-bit I/O configuration memory device mode. That is, in a 4-bit I/O configuration memory device mode, the least significant bit $A_0'$ serves as the most significant bit, and the most significant bit $A_9'$ serves as the least significant bit. On the other hand, in an 8-bit I/O configuration memory device mode, a tri-state buffer 50' is provided on the least significant bit $A_0'$.

In a 4-bit I/O configuration memory device mode, the mode setting circuit 8 causes the mode signal M to be "0". As a result, the tri-state buffer 50' is deactivated and the tri-state buffer 59' is activated. Therefore, the most significant bit $A_9'$ instead of the least significant bit $A_0'$ is supplied to the memory blocks 60 to 63, so that each of the memory blocks 60 to 63 is accessed by internal addresses designated by the mine bits $A_9'$, $A_1'$, . . . , and $A_8'$. Such internal addresses have a transition frequency depending upon every two synchronization clock signals SC as shown in FIG. 2. Therefore, the power consumption in the memory blocks 60 to 63 is reduced as compared with that in FIG. 1.

Also, simultaneously, the outputs of the gate circuits 706R and 706W of the I/O selection circuits 70 to 73 become "0", so that the tri-state buffers 703R and 703W are deactivated, while either the internal data lines $D_0$ to $D_3$ or the internal data lines $D_4$ to $D_7$ are selected and are connected to a special group of the data input/output pins such as $P_0$ to $P_3$. In this case, the least significant bit $A_0'$ is supplied via the OR circuit 9 to the gate circuits 704R, 705R, 704W and 705W. For example, if $A_0'$="1", the tri-state buffer 701R or 701W is activated, so that the internal data lines $D_0$ to $D_3$ are connected to the data input/output pins $P_0$ to $P_3$, respectively. On the other hand, if $A_0'$="0", the tri-state buffer 702R or 702W is activated, so that the internal data lines $D_4$ to $D_7$ are connected to the data input/output pins $P_0$ to $P_3$, respectively. Thus, the I/O selection circuits 70 to 73 are placed in an activated state, i.e., in a selection state by the least significant bit $A_0'$.

In an 8-bit I/O configuration memory device mode, the mode setting circuit 8 causes the mode signal M to be "1". As a result, the tri-state buffer 50' is activated while the tri-state buffer 59' is deactivated. Therefore, each of the memory blocks 60 to 63 is accessed by the lower bits $A_0'$, $A_1'$, . . . , and $A_8'$ of the internal addresses in the same way as in the device of FIG. 1. Also, the output of the OR circuit 9 becomes "1" regardless of the least significant bit $A_0'$, so that the gate circuits 704R or 704W of the I/O selection circuits 70 to 73 are activated, thus connecting the internal data lines $D_0$ to $D_3$ to the data input/output pins $P_0$ to $P_3$, respectively. Simultaneously, the outpus of the gate circuits 706R and 706W of the I/O selection circuits 70 to 73 become "1", so that the tri-state buffers 703R and 703W are activated, thus connecting the internal data lines $D_4$ to $D_7$ to the data input/output pins $P_4$ to $P_7$. Thus, the I/O selection circuits 70 to 71 are in a deactivated state, i.e., in a nonselection state by the least significant bit $A_9'$, so that the internal data lines $D_0$ to $D_7$ are connected to the data input output pins $P_0$ to $P_7$, respectively.

Thus, according to the first embodiment, in a 4-bit I/O configuration memory device mode, the least significant bit $A_0'$ is exchanged with the most significant bit $A_9'$. That is, the least significant bit $A_0'$ which has the largest transition frequency is used for controlling the I/O selection circuits 70 to 73, while the most significant bit $A_9'$ while has the smallest transition frequency is used for accessing the memory blocks 60 to 63. Thus, the power consumption in the decoders, the amplifiers and the like of the memory blocks 60 to 63 can be reduced.

Figure 4:
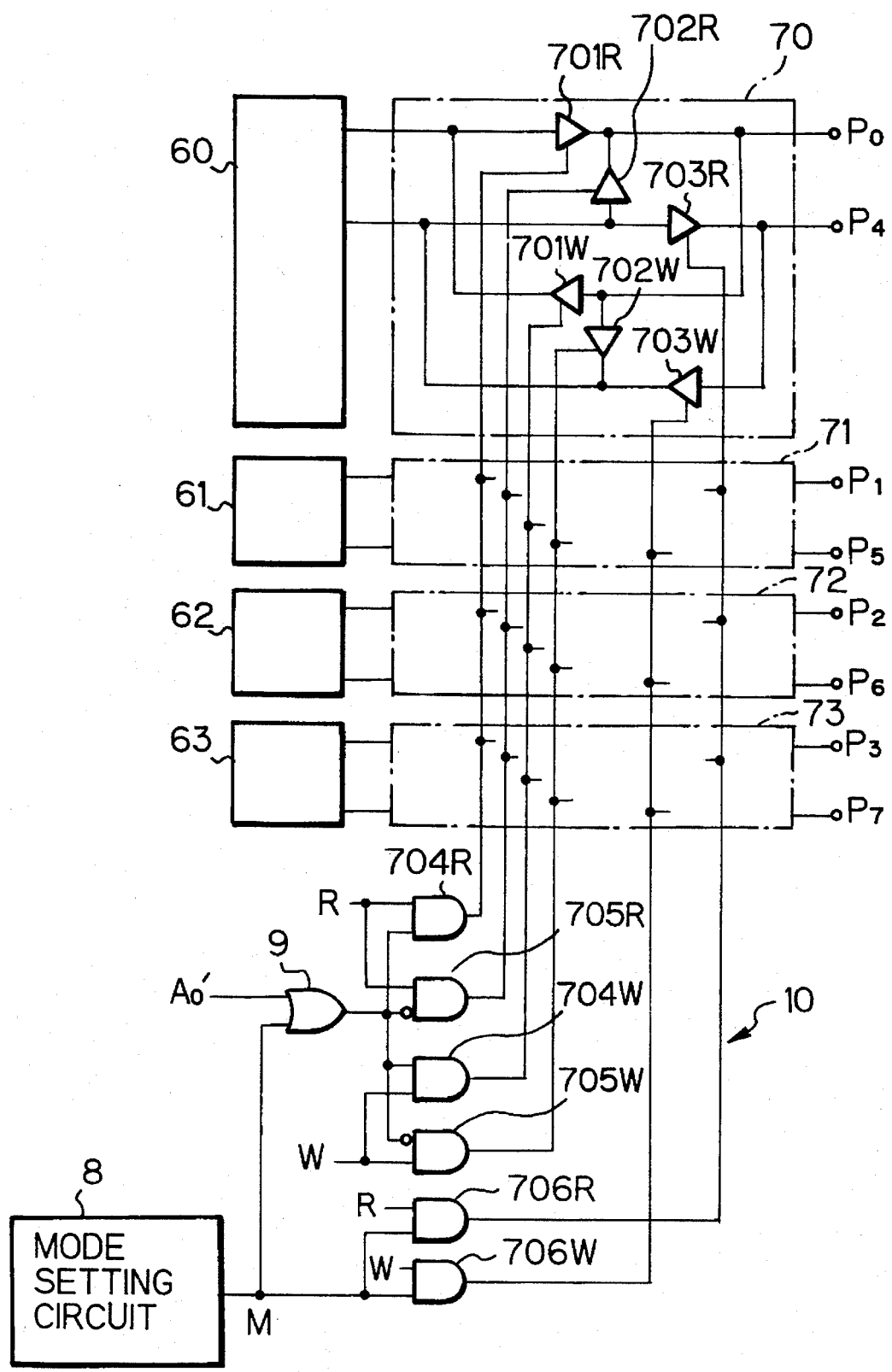
FIG. 4 is a partial circuit diagram illustrating a modification of the device of FIG. 3.

In FIG. 4, which illustrates a modification of the device of FIG. 3, the gate circuits 704R, 705R, 706R, 704W, 705W and 706W which form an I/O control circuit 10 are provided commonly for the I/O selection circuits 70 to 73, thus reducing the circuitry elements.

Figure 5:
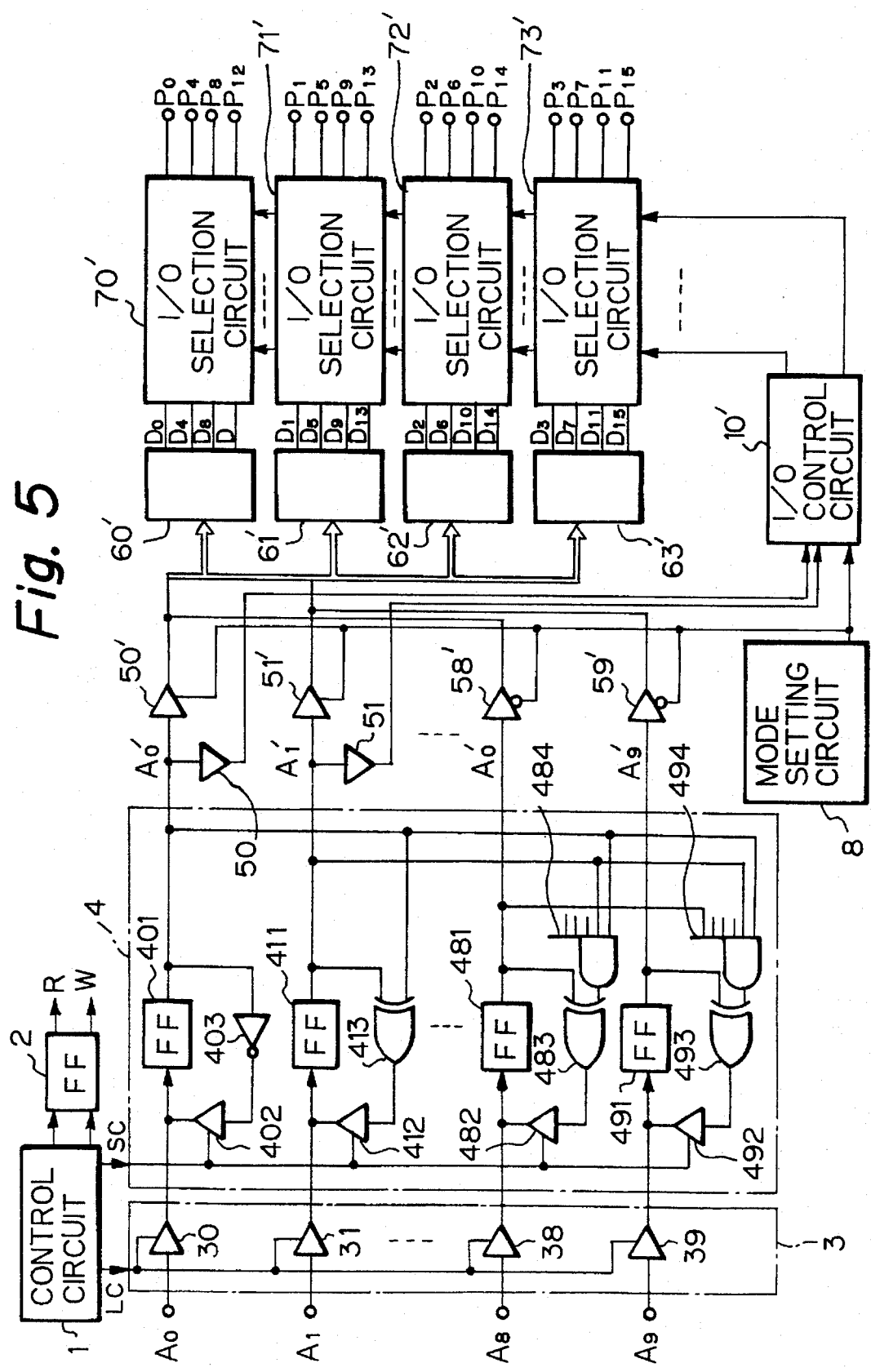
FIG. 5 is a circuit diagram illustrating a second embodiment of the synchroous semiconductor memory device according to the present invention.

In FIG. 5, which illustrates a second embodiment of the present invention, a 4-bit I/O configuration memory device and a 16-bit I/O configuration memory device are manufactured on one chip, and one of the devices is selected and fixed at a wiring step or the like. In this case, a memory block 60' has internal data lines $D_0$, $D_4$, $D_8$ and $D_{12}$, a memory block 61' has internal data lines $D_1$, $D_5$, $D_9$ and $D_{13}$, a memory block 62' has internal data lines $D_2$, $D_6$, $D_{10}$ and $D_{14}$, and a memory block 60' has internal data lines $D_3$, $D_7$, $D_{11}$ and $D_{15}$. That is, four groups of the internal data lines $D_0$ to $D_3$, $D_4$ to $D_7$, $D_8$ to $D_{11}$, and $D_{12}$ to $D_{15}$ are provided. Similarly, an I/O selection circuit 70' has data input/output pins $P_0$, $P_4$, $P_8$ and $P_{12}$, an I/O selection circuit 71' has data input/output pins $P_1$, $P_5$, $P_9$ and $P_{13}$, an I/O selection circuit 72' has data input/output pins $P_2$, $P_6$, $P_{10}$ and $P_{14}$, and an I/O selection circuit 73' has data input/output pins $P_3$, $P_7$, $P_{11}$ and $P_{15}$. That is, four groups of the data input/output pins $P_0$ to $P_3$, $P_4$ to $P_7$, $P_8$ to $P_{11}$, and $P_{12}$ to $P_{15}$ are provided. That is, in a 4-bit I/O configuration memory device mode, only the data input/output pins $P_0$ and $P_3$ are made effective. Therefore, in this case, the I/O selection circuits 70' to 73' are activated, so that one group of the internal data lines $D_0$ and $D_3$, the internal data lines $D_4$ to $D_7$ the internal data lines $D_8$ to $D_{11}$, and the internal data lines $D_{12}$ to $D_{15}$ are selected and are connected to the data input/output pins $P_0$ to $P_3$. On the other hand, in a 16-bit I/O configuration memory device mode, all the data input/output pins $P_0$ to $P_{15}$ are mode effective. Therefore, in this case, the I/O selection circuits 70' to 73' are deactivated, i.e., the I/O selection circuits 70' to 73' are in a through state, so that the internal data lines that the internal data lines $D_0$ to $D_{15}$ are connected to the data input/output pins $P_0$ to $P_{15}$, respectively. Such a connection is carried out by the I/O selection circuits 70' to 73' which are also controlled by an I/O control circuit 10'.

In FIG. 5, the buffers 50 and 51 are connected to the I/O control circuit 10' in order to supply the lower bits $A_0'$ and $A_1'$ to the I/O control circuit 10' in a 4-bit I/O configuration memory device mode. Also, tri-state buffers 58' and 59' are provided instead of the buffers 58 and 59 of FIG. 1 and are connected to the lower bit sides of the memory blocks 60' to 63', in order to supply the higher bits $A_8'$ and $A_9'$ to the memory blocks 60' to 63' in an 8-bit I/O configuration memory device mode. That is, in a 4-bit I/O configuration memory device mode, the lower bits $A_0'$ and $A_1'$ serve as the higher bits, and the higher bits $A_8'$ and $A_9'$ serve as the lower bits. On the other hand, in a 16-bit I/O configuration memory device mode, tri-state buffers 50' and 51' are provided on the lower bits $A_0'$ and $A_1'$.

Figure 6:
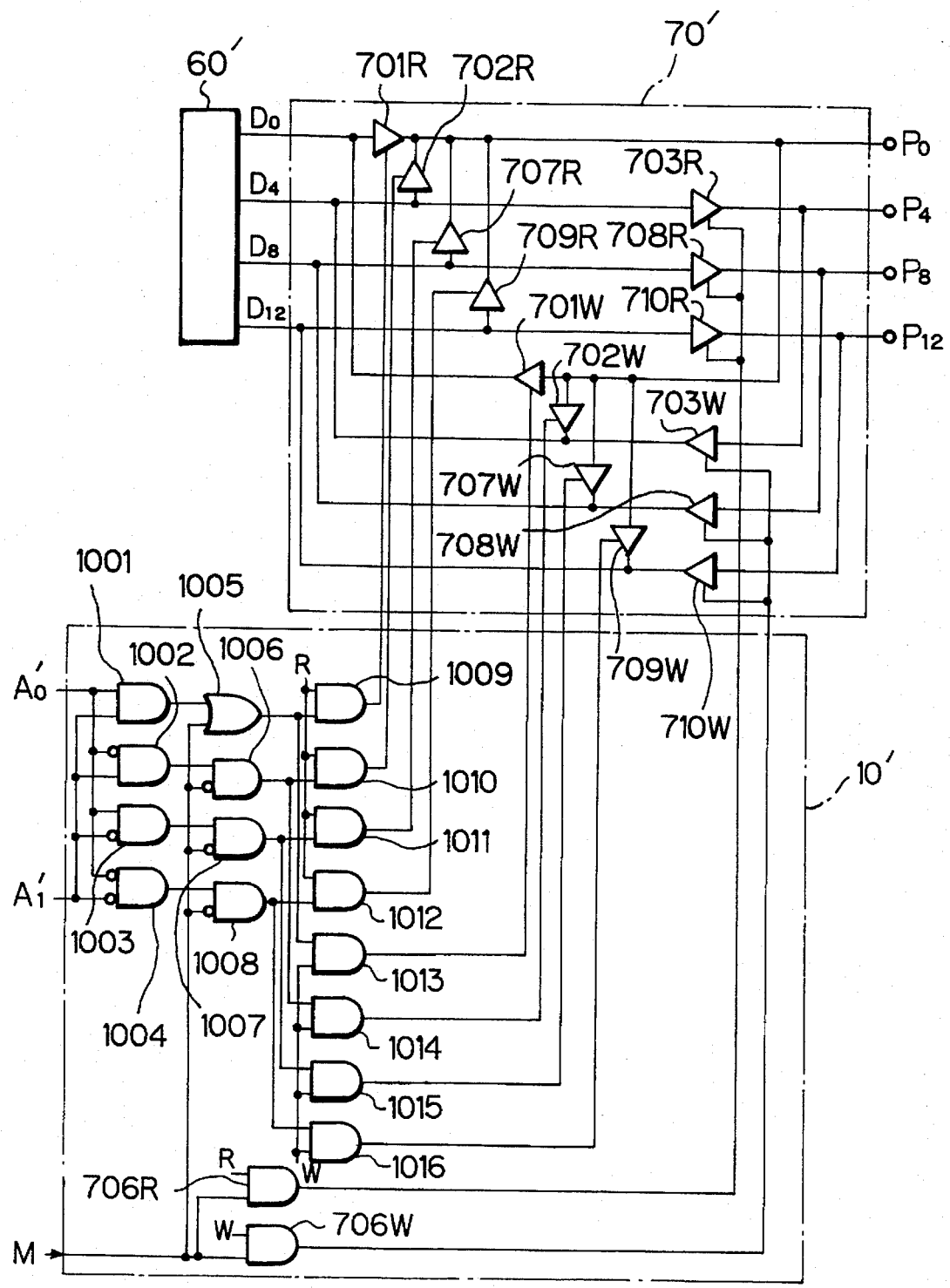
FIG. 6 is a partial detailed circuit diagram of the device of FIG. 5.

In FIG. 6, which is a detailed circuit of the I/O selection circuit 70' and the I/O control circuit 10' of FIG. 5, the I/O slection circuit 70 is constructed by tri-state buffers 701R to 703R and 707R to 710R operated in a read mode (R="1"), and tri-state buffers 701W to 703W and 707W to 710W operated in a write mode (W="1"). Also, the I/O control circuit 10' is constructed by gate circuits 1001 to 1004 for decoding the lower bits $A_0'$ and $A_1'$, gate circuits 1005 to 1008 controlled by the mode signal M, gate circuits 1009 to 1012 controlled by the read signal R, and gate circuits 1013 to 1016 controlled by the write signal W.

In a 4-bit I/O configuration memory device mode, the mode setting circuit 8 causes the mode signal M to be "0". As a result, the tri-state buffers 50' and 51' are deactivated and the tri-state buffers 58' and 59' are activated. Therefore, the higher bits $A_8'$ and $A_9'$ instead of the lower bits $A_0'$ and $A_1'$ are supplied to the memory blocks 60' to 63', so that each of the memory blocks 60' to 63' is accessed by internal addresses designated by the eight bits $A_8', A_9', A_3', \ldots$. Such internal addresses have a transition frequency depending upon every four synchronization clock signals SC as shown in FIG. 2. Therefore, the power consumption in the memory blocks 60 to 63 is reduced.

Also, simultaneously, the outputs of the gate circuits 706R and 706W of the I/O selection circuits 70' to 73' become "0", so that the tri-state buffers 703R, 708R, 710R, 703W, 708W and 710W are deactivated, while one group of the internal data lines $D_0$ to $D_3$, the internal data lines $D_4$ to $D_7$, the internal data lines $D_8$ to $D_{11}$, and the internal data line $D_{12}$ to $D_{15}$ are selected and are connected to a special group of the data input/output pins such as $P_0$ to $P_3$. In this case, the lower bits $A_0'$ and $A_1'$ are supplied via to the gate circuits 1001 to 1004 of the decoder of the I/O control circuit 10'.

If $A_0'="1"$ and $A_1'="1"$, the output of the gate circuit 1001 is "1". In this case, since M="0", any of the decoding outputs of the gate circuits 1001 to 1004 can pass through the gate circuits 1005 to 1008. Therefore, the output of the gate circuit 1001 passes through the gate circuit 1005 and reaches the gate circuits 1009 and 1013. Therefore, since the tri-state buffer 701R or 701W is activated by the read signal R or the write signal W, the internal data lines $D_0$ to $D_3$ are connected to the data input/output pins $P_0$ to $P_3$, respectively.

Also, if $A_0'="0"$ and $A_1'="1"$, the output of the gate circuit 1002 is "1". Therefore, the output of the gate circuit 1002 passes through the gate circuit 1006 and reaches the gate circuits 1010 and 1014. Therefore, since the tri-state buffer 702R or 702W is activated by the read signal R or the write signal W, the internal data lines $D_4$ to $D_7$ are connected to the data input/output pins $P_0$ to $P_3$, respectively.

Further, if $A_0'="1"$ and $A_1'="0"$, the output of the gate circuit 1003 is "1". Therefore, the output of the gate circuit 1003 passes through the gate circuit 1007 and reaches the gate circuits 1011 and 1015. Therefore, since the tri-state buffer 707R or 707W is activated by the read signal R or the write signal W, the internal data lines $D_8$ to $D_{11}$ are connected to the data input/output pins $P_0$ to $P_3$, respectively.

Still further, if $A_0'="0"$ and $A_1'="0"$, the output of the gale circuit 1004 is "1". Therefore, the output of the gale circuit 1004 passes through the gate circuit 1008 and reaches the gate circuits 1012 and 1016. Therefore, since the tri-state buffer 709R or 709W is activated by the read signal R or the write signal W, the internal data lines $D_{12}$ to $D_{15}$ are connected to the data input/output pins $P_0$ to $P_3$, respectively.

In a 16-bit I/O configuration memory device mode, the mode setting circuit 8 causes the mode signal M to be "1". As a result, the tri-state buffer 50' and 51' are activated while the tri-state buffers 58' and 59' are deactivated. Therefore, each of the memory blocks 60' to 63' is accessed by the eight lower bits $A_0', A_1', \ldots$, and $A_7'$ of the internal addresses.

Also, simultaneously, the output of the gate circuit 1005 becomes "1" and the outputs of the gate circuits 1006 to 1008 become "0" regardless of the lower bits $A_0'$ and $A_1'$. Therefore, the tri-state buffer 701R or 701W is activated by the output of the gate circuit 1009 or 1013, and as a result, the internal data lines $D_0$ to $D_3$ are connected to the data input/output pins $P_0$ to $P_3$, respectively. Further, simultaneously, the output of the gate circuit 706R or 706W becomes "1", so that either the tri-state buffers 703R, 708R and 710R or the tri-state buffers 703W, 708W and 710W are activated. Therefore, the internal data lines $D_4$ to $D_7$ are connected to the data input/output pins $P_4$ to $P_7$, respectively, the internal data lines $D_8$ to $D_{11}$ are connected to the data input/output pins $P_8$ to $P_{11}$, respectively, and the internal data lines $D_{12}$ to $D_{15}$ are connected to the data input/output pins $P_{12}$ to $P_{15}$, respectively. Thus, the I/O selection circuits 70' to 71' are placed in a deactivated state, i.e., in a nonselection state by lower bits $A_0'$ and $A_1'$ so that the internal data lines $D_0$ to $D_{15}$ are connected to the data input/output pins $P_0$ to $P_{15}$, respectively.

Thus, according to the second embodiment, in a 4-bit I/O configuration memory device mode, the lower bits $A_0'$ and $A_1'$ are exchanged with the higher bits $A_8'$ and $A_9'$. That is, the lower bits $A_0'$ and $A_1'$ which have larger transition frequency are used for controlling the I/O selection circuits 70' to 73', while the higher bits $A_8'$ and $A_9'$ which have smaller transition frequency are used for accessing the memory blocks 60' to 63'. Thus, the power consumption in the decoders, the amplifiers and the like of the memory blocks 60' to 63' can be reduced.

Figure 7A:
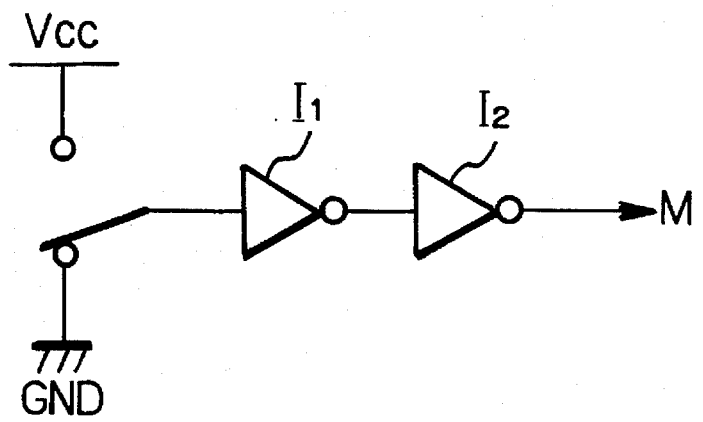
FIGS. 7A and 7B are circuit diagrams of an example of the mode setting circuit of FIGS. 1, 3 and 5.
Figure 7B:
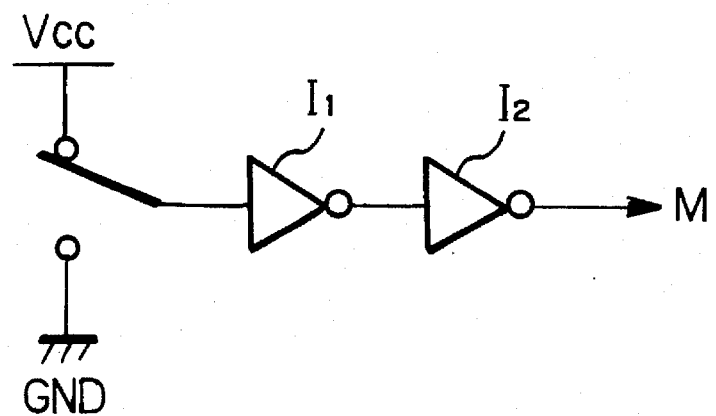

In FIGS. 7A and 7B, which illustrate an example of the mode setting circuit of FIGS. 1, 3 and 5, two inverters $I_1$ and $I_2$ in series are manufactured on a semiconductor chip in advance. Then, in a wiring forming step, if a wiring pattern is formed between an input of the inverter $I_1$ and a ground power supply terminal (pad) GND as shown in FIG. 7A, the mode signal M is fixed at "0" (low level). Also, if a wiring pattern is formed between the input of the inverter $I_1$ and a power supply terminal (pad) $V_{cc}$ as shown in FIG. 7B, the mode signal M is fixed at "1" (high level).

Figure 8A:
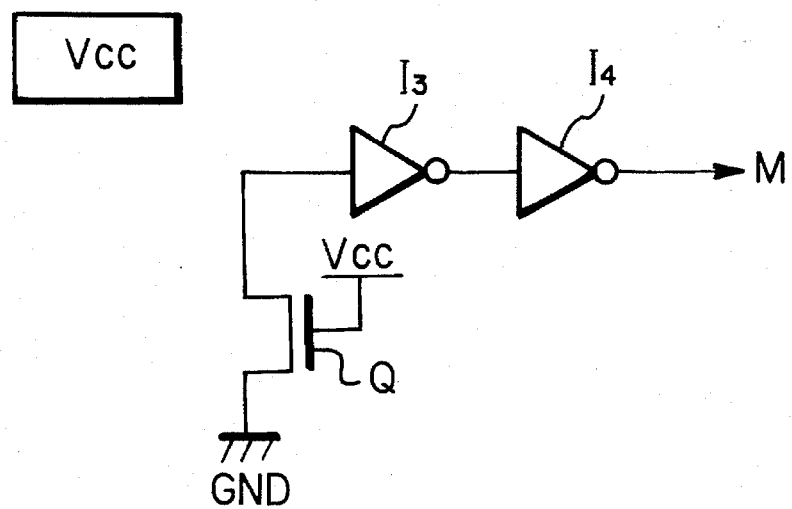
FIGS. 8A and 8B are circuit diagrams of another example of the mode setting circuit of FIGS. 1, 3 and 5.
Figure 8B:
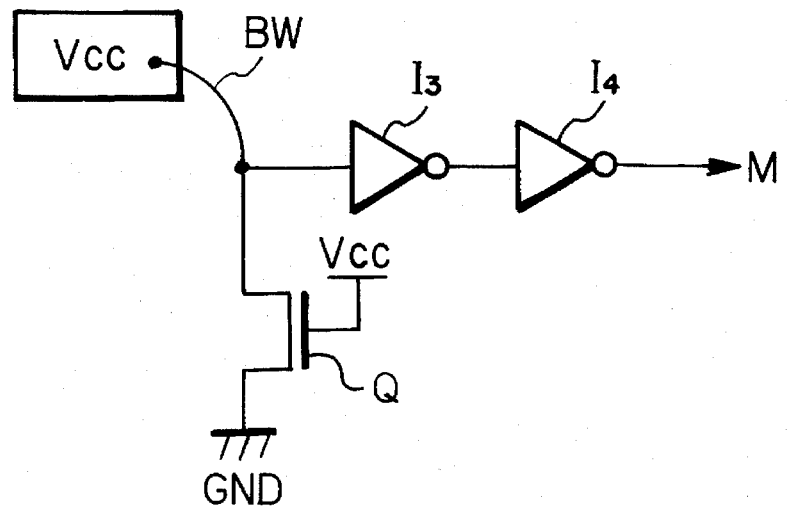

In FIGS, 8A and 8B, which illustrate another example of the mode setting circuit of FIGS. 1, 3 and 5, two inverters $I_3$ and $I_4$ in series and a MOS transistor Q are manufactured on a semiconductor chip in advance. Then, in a bonding step, no bonding wiring is performed as shown in FIG. 8A, so the mode signal M is fixed at "0" (low level). Also, since a bonding wiring BW is performed as shown in FIG. 8B, the mode signal M is fixed at "1" (high level).

Figure 9:
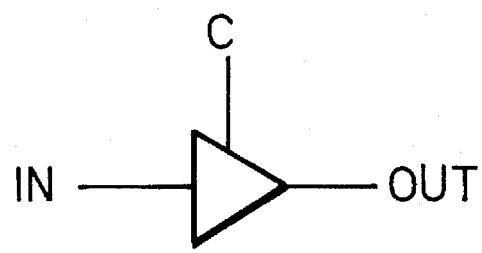
FIG. 9 is a circuit diagram of the tri-state buffer of FIGS. 1, 3 and 5.
Figure 9:
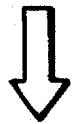
Figure 9:
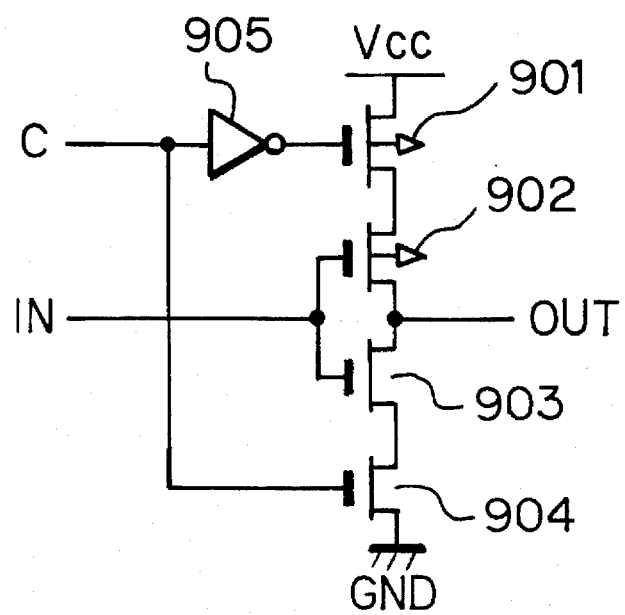

In FIG. 9, which illustrates an example of the tri-state buffer such as 402 of FIGS. 1, 3 and 5, P-channel MOS transistors 901 and 902 and N-channel MOS transistors 903 and 904 are connected in series between a $v_{cc}$ power supply line and a GND line. In this case, the gate of the P-channel transistor 901 is controlled via an inverter 905 by a control signal C, and the gate of the N-channel transistor 904 is controlled directly by the control signal C. Therefore, when C="0", the tri-state buffer is in a high impedance state, while, when C="1", an output signal OUT is an inverted signal of an input signal IN.

Figure 10:
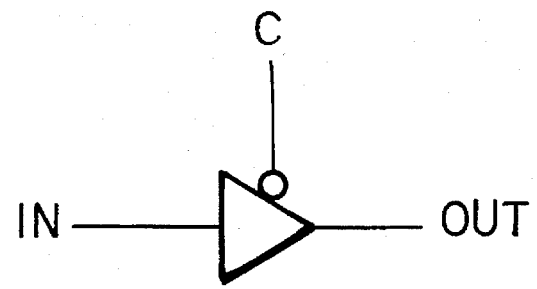
FIG. 10 is a circuit diagram of the tri-state buffer of FIGS. 3 and 5.
Figure 10:
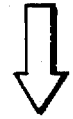
Figure 10:
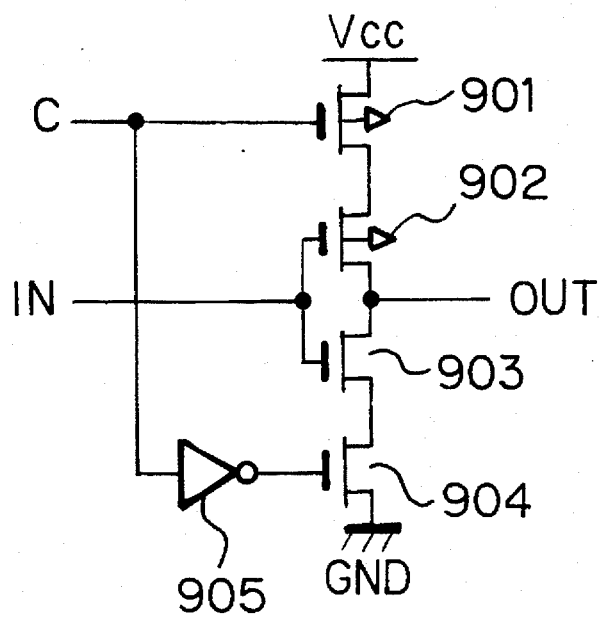

In FIG. 10, which illustrates an example of the tri-state buffer such as 59' of FIGS. 3 and 5, the inverter 905 of FIG. 9 is connected to the gate of the N-channel transistor 904. Therefore, when C="1", the tri-state buffer is in a high impedance state, while, when C="0", an output signal OUT is an inverted signal of an input signal IN.

Figure 11:
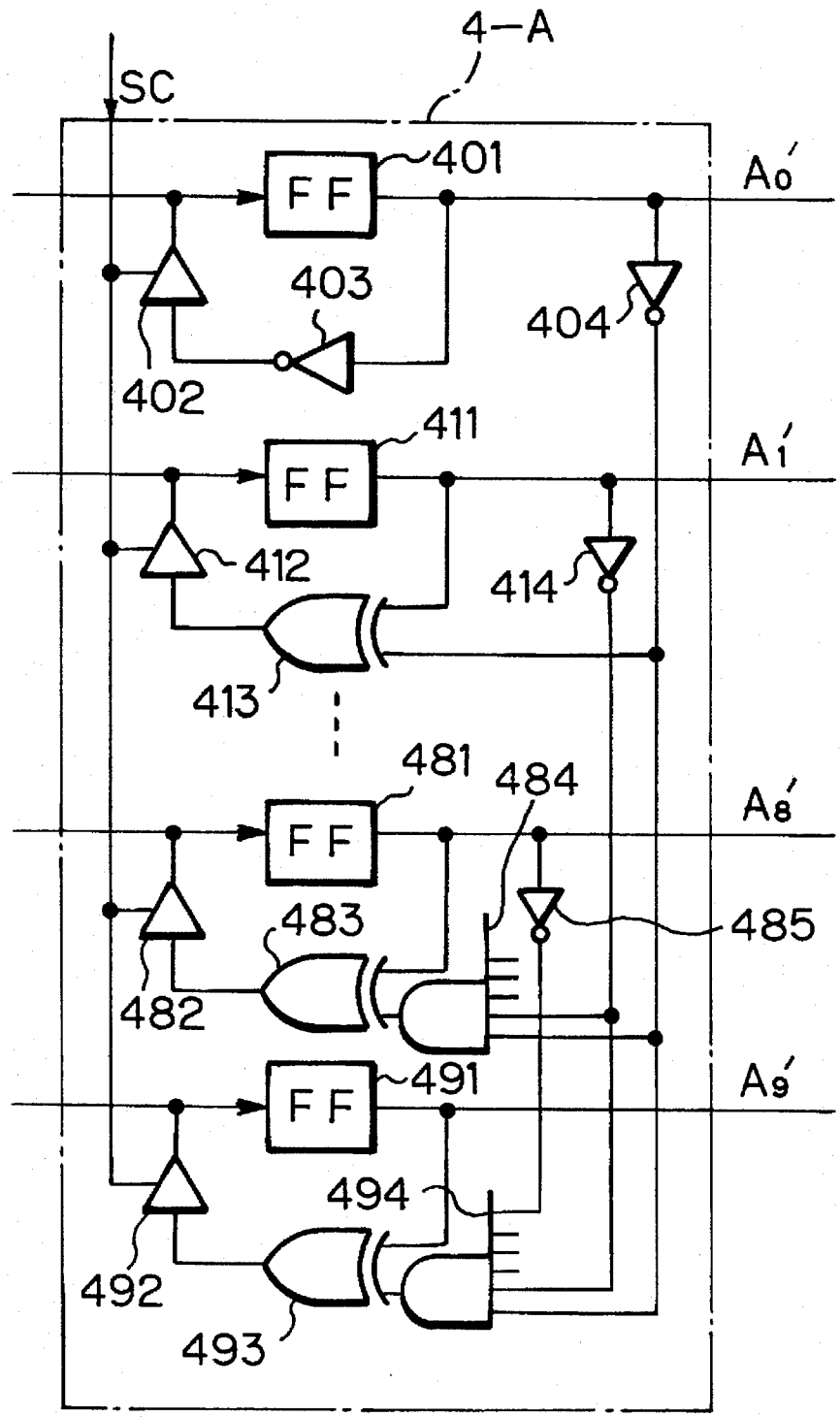
FIG. 11 is a circuit diagram of a modification of the burst counter of FIGS. 3 and 5.
Figure 12:
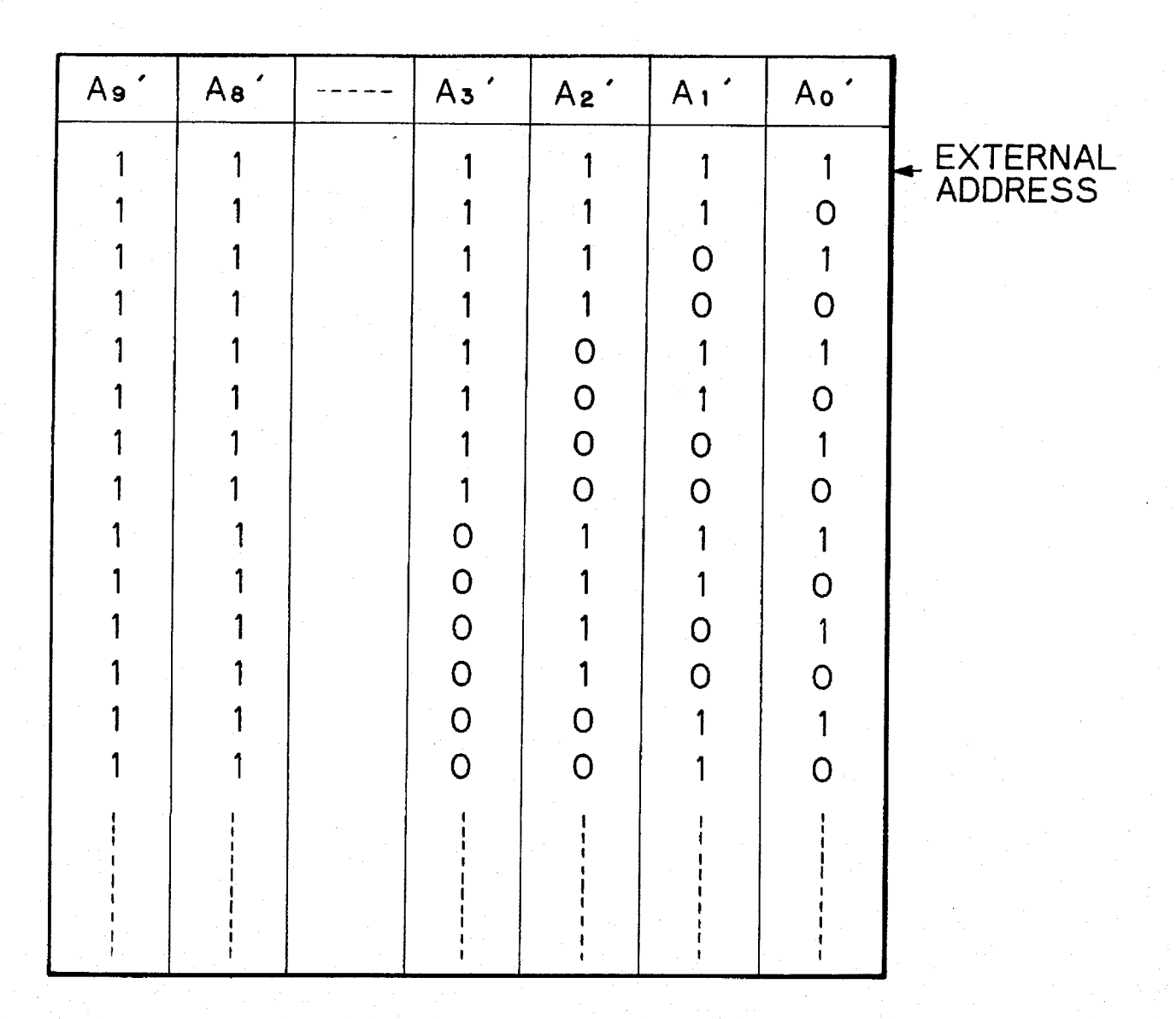

In FIG. 11, which is a modification of the burst counter 4 of FIGS. 3 and 5, a burst counter 4-A includes inverters 404, 414, ..., 485 in addition to the elements of the burst counter 4 of FIGS. 3 and 4. In this case, when the synchronization clock signal SC is received by the burst counter 4-A, the content of the burst counter 4-A is decremented by 1 as shown in FIG. 12. Therefore, the least significant bit $A_0'$ also has the largest transition frequency in the same way as in the burst counter 4 of FIGS. 3 and 5, the burst counter 4 of FIGS. 3 and 5 can be replaced by the burst counter 4-A of FIG. 11.

Figure 13:
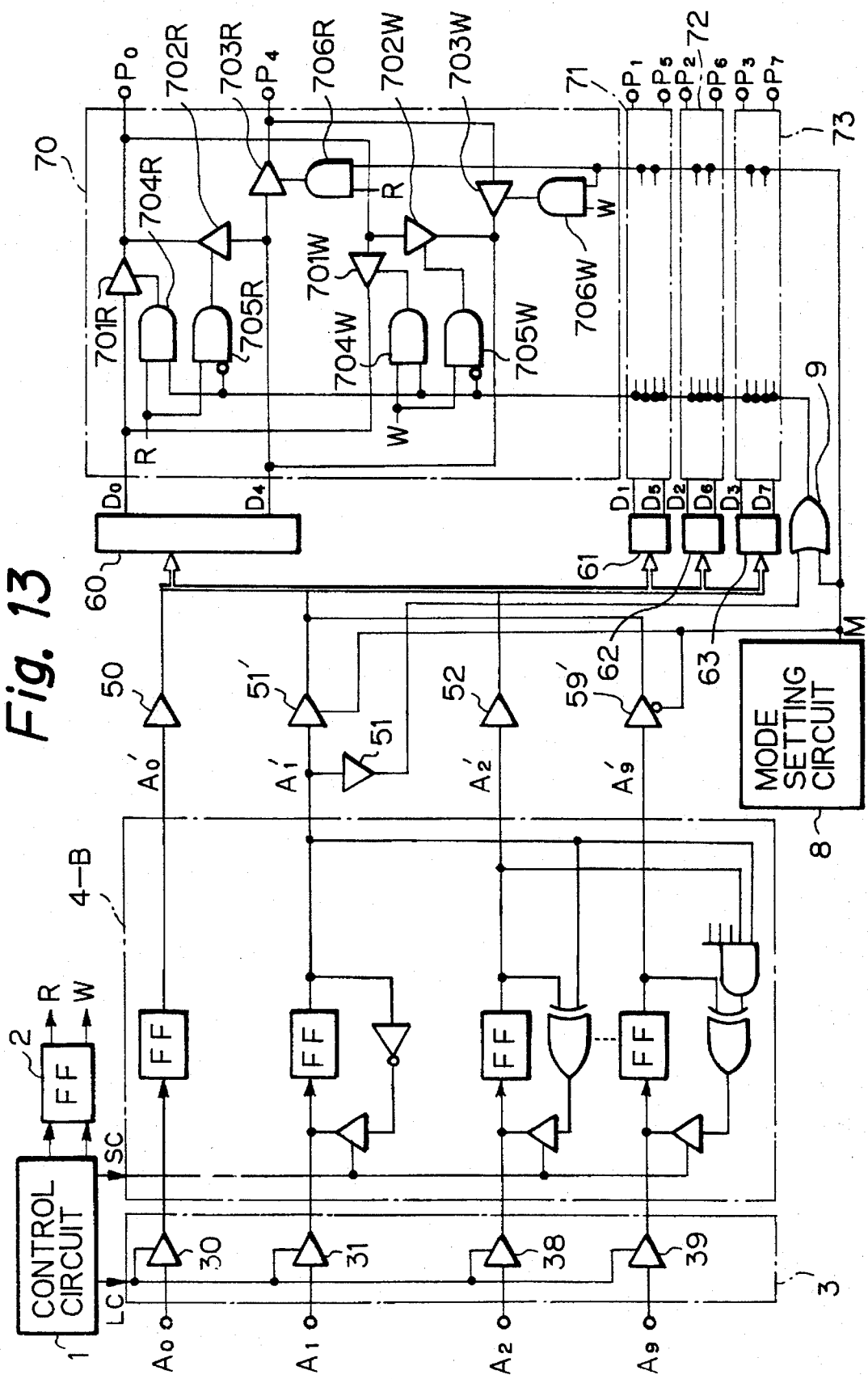
FIG. 13 is a circuit diagram illustrating a third embodiment of the synchronous semiconductor memory device according to the present invention.
Figure 14:
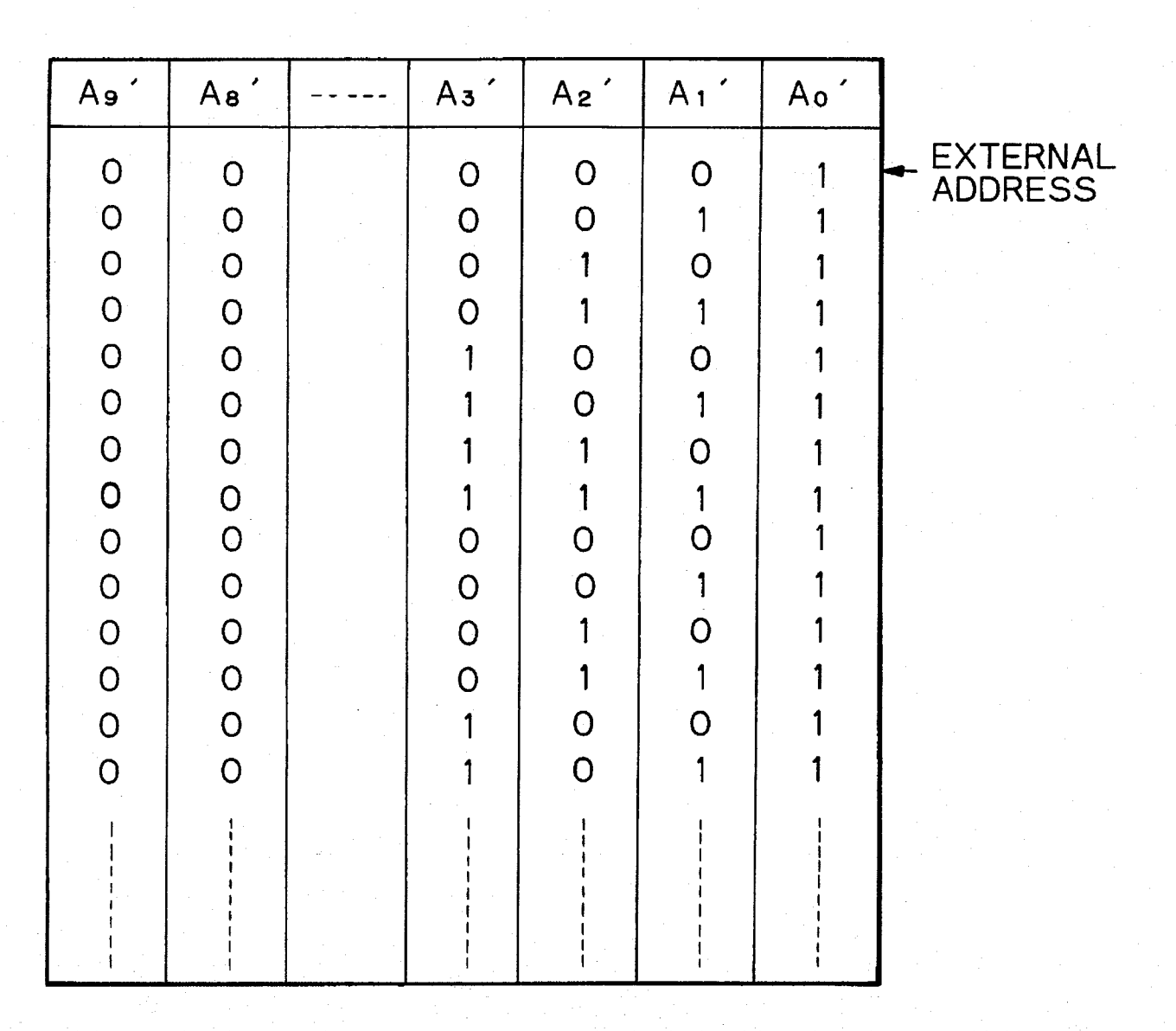

In FIG. 13, which illustrates a third embodiment of the present invention, a burst counter 4-B which has a burst length of 2 is provided instead of the burst counter 4 of FIG. 3 which has a burst length of 1. In this case, as shown in FIG. 14, which shows the content of the burst counter 4-B, the second least significant bit $A_1'$ has the largest transition frequency. Therefore, the buffer 51 instead of the buffer 59 of FIG. 1 is connected to the OR circuit 9, in order to supply the second least significant bit $A_1'$ to the I/O selection circuits 70 to 73 in a 4-bit I/O configuration memory device mode. Also, the tri-state buffer 59' is connected to the second least significant bit sides of the memory blocks 60 to 63, in order to supply the most significant bit $A_9'$ to the memory blocks 60 to 63 in a 4-bit I/O configuration memory device mode. That is, in a 4-bit I/O configuration memory device mode, the second least significant bit $A_1'$ serves as the most significant bit, and the most significant bit $A_9'$ serves as the second least significant bit. On the other hand, in an 8-bit I/O configuration memory device mode, a tri-state buffer 51' is provided on the second least significant bit $A_1'$.

Generally, in FIG. 3, if the burst counter has a burst length of $2^N$ (N=1, 2, ... ), the N-th least significant bit $A_{N-1}'$ has the largest transition frequency. Therefore, in a 4-bit I/O configuration memory device mode, the N-th least significant bit $A_{N-1}'$ is supplied to the I/O selection circuits 70 to 73. Also, in a 4-bit I/O configuration memory device mode, the most significant bit $A_9'$ is supplied to the memory blocks 60 to 63. That is, in a 4-bit I/O configuration memory device mode, the N-th least significant bit $A_{N-1}'$ serves as the most significant bit, and the most significant bit $A_9'$ serves as the N-th least significant bit.

Figure 15:
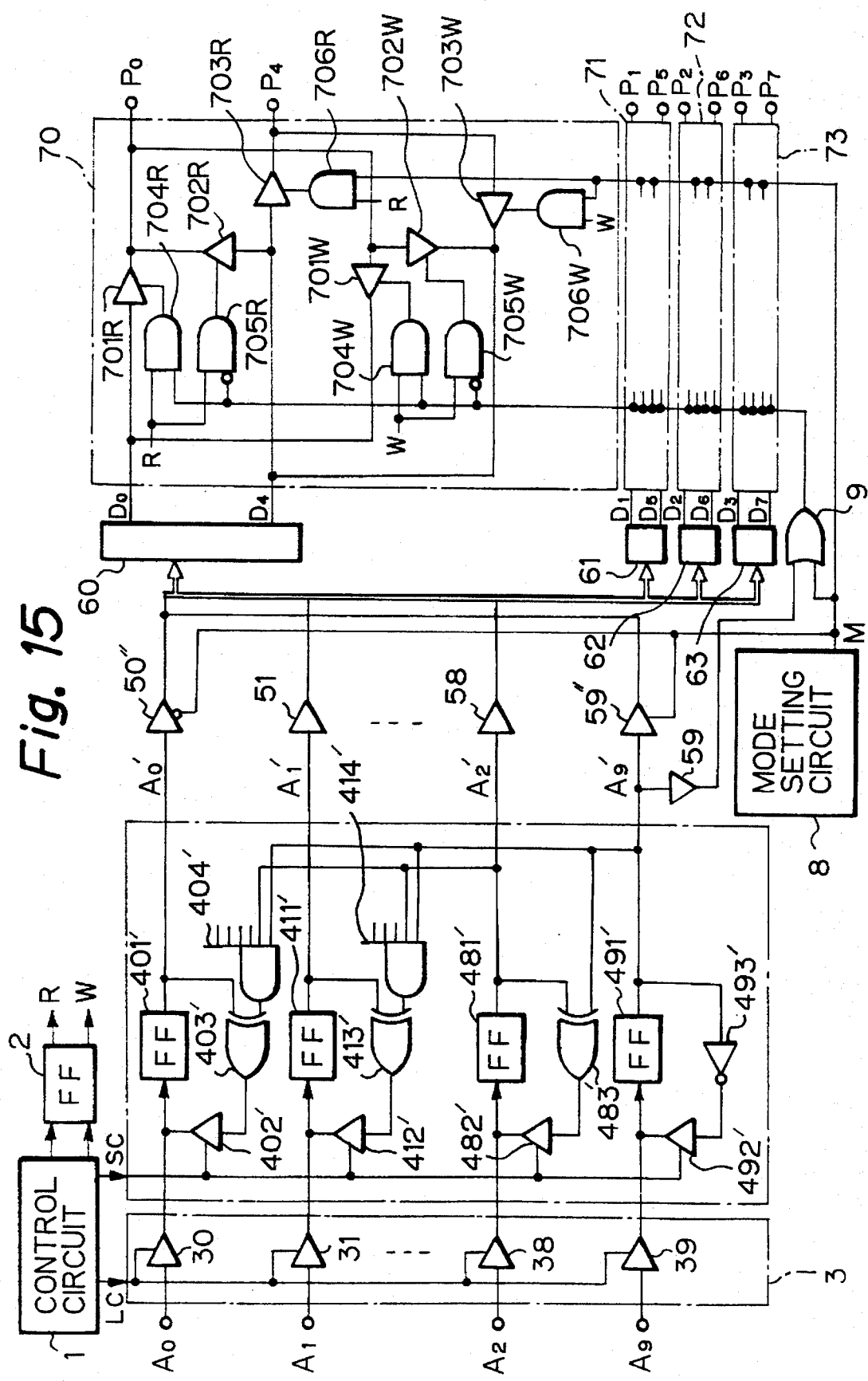
FIG. 15 is a circuit diagram illustrating a fourth embodiment of the synchronous semiconductor memory device according to the present invention.
Figure 16:
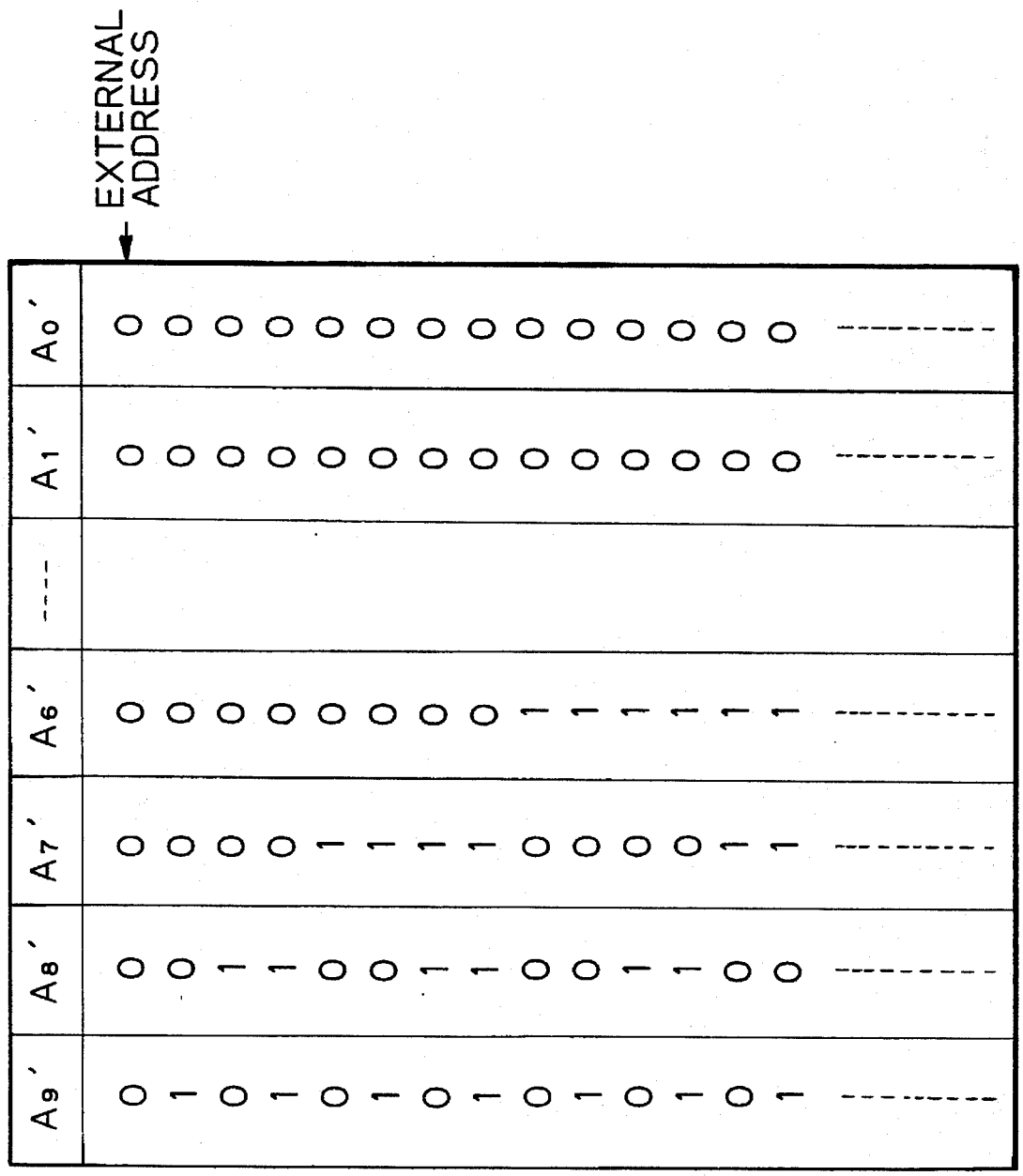
FIG. 16 is a table showing examples of the internal addresses of the burst counter of FIG. 15.

In FIG. 15, which illustrates a fourth embodiment of the present invention, a burst counter 4-C is constructed by a flip-flop 401', a tri-state buffer 402' an exclusive OR circuit 403' and an AND circuit 404' for the external address $A_0$; a flip-folp 411', a tri-state buffer 412' an exclusive OR circuit 413' and an 4ND circuit 414' for the external address $A_0$; . . .; a flip-flop 481', a tri-state buffer 482' and an exclusive OR circuit 483' for the external address $A_8$; and a flip-flop 491', a tri-state buffer 492' and an exclusive OR circuit 493' for the external address $A_9$. As a result, every time the burst counter 4-C receives the synchronization clock signal SC, the content of the burst counter 4-C is counted down by 1, to generate a 9-bit internal address designated by $A_0'$, $A_1'$, . . . , $A_8'$ and $A_9'$ as shown in FIG. 16. In FIG. 16, note that the external address $(A_0, A_1, \ldots, A_8, A_9) = (A_0', A_1', \ldots, A_8', A_9')$ is 0000000000.

As shown in FIG. 16, the most significant bit $A_9'$ has the largest transition frequency. Therefore, a tri-state buffer 50" is provided instead of the buffer 50 and a tri-state buffer 59" is added, in order to supply the most significant bit $A_9'$ to the memory blocks 60 to 63 in an 8-bit I/O configuration memory device mode. That is, in a 4-bit I/O configuration memory device mode, the lower bits $A_0'$, $A_1'$, . . . , $A_8$ are used for accessing the memory blocks 60 to 63 and the most significant bit $A_9$ is used for controlling the I/O selection circuits. On the other hand, in an 8-bit I/O configuration memory device mode, the higher bits $A_1'$, $A_2'$, . . . , $A_9$ are used for accessing the memory blocks 60 to 63.

Note that the present invention can be generally applied to a synchronous semiconductor memory device where an M (M=1, 2, ... )-bit I/O configuration memory device and an M×$2^k$ (k=1,2, ... )-bit I/O configuration memory device are manufactured on one chip and one of the devices is selected and fixed at a wiring forming step or a bonding step. Also, the present invention can be applied to an interleave mode. In the interleave mode, for example, if the burst length is 4, the two lower bits $(A', A_1')$ are changed from (0, 0) via (0, 1) and (1, 0) to (1, 0), from (0, 1) via (0, 0) and (1, 1) to (1, 0), from (1, 0) via (1, 1) and (0, 0) to (0, 1), or from (1, 1) via (1, 0) and (0, 1) to (0, 0).

As explained hereinbefore, according to the present invention, since the memory section is accessed by some bits of internal addresses having a smaller transition frequency, the power consumption in the memory section can be reduced to reduce the power consumption of the device.

I claim:

1. A synchronous semiconductor device comprising:

an internal address generating means for generating an m(m=2, 3, ... )-bit internal address which is successively changed;

a memory section accessed by n(n<m) bits and having $2^{m-n}$ groups of internal data lines;

$2^{m-n}$ groups of data input/output pins;

M (M=1, 2, ... )-bit input/output configuration memory device mode setting means for accessing said memory section by n bits of said m-bit internal address having smaller transition frequencies and for selecting one group of said $2^{m-n}$ groups of internal data lines by (m−n) bits of said m-bit internal address having larger transition frequencies to connect said selected group of internal data lines to one group of said $2^{m-n}$ groups of data input/output pins; and M×$2^{m-n}$-bit input/output configuration memory device mode setting means for accessing said memory section by n bits of said m-bit internal address having larger transition frequencies and for connecting said $2^{m-n}$ groups of internal data lines to said $2^{m-n}$ groups of data input/output pins.

2. A device as set forth in claim 1, wherein said internal address generating means receives a synchronization clock signal to increment said m-bit internal address by 1, said n bits of said m-bit internal address having smaller transition frequencies being higher n bits of said m-bit internal address, said (m−n) bits of said m-bit internal address having larger transition frequencies being lower (m−n) bits of said m-bit internal address, said n bits of said m-bit internal address having larger transition frequencies being lower n bits of said m-bit internal address.

3. A device as set forth in claim 1, wherein said internal address generating means receives a synchronization clock signal (SC)to decrement said m-bit internal address by 1, said n bits of said m-bit internal address having smaller transition frequencies being higher n bits of said m-bit internal address, said (m–n) bits of said m-bit internal address having larger transition frequencies being lower (m–n) bits of said m-bit internal address, said n bits of said m-bit internal address having larger transition frequencies being lower n bits of said m-bit internal address.

4. A device as set forth in claim 1, wherein said internal address generating means receives a synchronization clock signal to increment said m-bit internal address by 2, said n bits of said m-bit internal address having smaller transition frequencies being higher n bits of said m-bit internal address, and the least significant bit thereof, said (m–n) bits of said m-bit internal address having larger transition frequencies being lower (m–n) bits of said m-bit internal address except for the least significant bit thereof, said n bits of said m-bit internal address having larger transition frequencies being lower n bits of said m-bit internal address.

5. A device as set forth in claim 1, wherein said internal address generating means receives a synchronization clock signal to decrement said m-bit internal address by 2, said n bits of said m-bit internal address having smaller transition frequencies being higher n bits of said m-bit internal address and the least significant bit thereof, said (m–n) bits of said m-bit internal address having larger transition frequencies being lower (m–n) bits of said m-bit internal address except for the least significant bit thereof, said n bits of said m-bit internal address having larger transition frequencies being lower n bits of said m-bit internal address.

6. A device as set forth in claim 1, wherein said internal address generating means receives a synchronization clock signal to increment said m-bit internal address by $2^{N-1}$(N=3, 4, . . . ), said n bits of said m-bit internal address having smaller transition frequencies being higher n bits of said m-bit internal address and the least significant bits to the N-th least significant bits thereof, said (m–n) bits of said m-bit internal address having larger transition frequencies being lower (m–n) bits of said m-bit internal address except for the least significant bits to the N-th least significant bits thereof, said n bits of said m-bit internal address having larger transition frequencies being lower n bits of said m-bit internal address.

7. A device as set forth in claim 1, wherein said internal address generating means receives a synchronization clock signal to decrement said m-bit internal address by $2^{N-1}$(N=3, 4, . . . ), said n bits of said m-bit internal address having smaller transition frequencies being higher n bits of said m-bit internal address and the least significant bits to the N-th least significant bits thereof, said (m–n) bits of said m-bit internal address having larger transition frequencies being lower (m–n) bits of said m-bit internal address except for the least significant bits to the N-th least significant bits thereof, said n bits of said m-bit internal address having larger transition frequencies being lower n bits of said m-bit internal address.

8. A device as set forth in claim 1, wherein said internal address generating means receives a synchronization clock signal to change said m-bit internal address so that higher bits of said m-bit internal address have larger transition frequencies than lower bits of said m-bit internal address;

said n bits of said m-bit internal address having smaller transition frequencies being lower n bits of said m-bit internal address, said (m–n) bits of said m-bit internal address having larger transition frequencies being higher (m–n) bits of said m-bit internal address, said n bits of said m-bit internal address having larger transition frequencies being lower n bits of said m-bit internal address.

9. A synchronous semiconductor device comprising:

an internal address generating means for generating an m (m=2, 3, . . . )-bit internal address which is successively changed;

a memory section accessed by n(n<m) bits and having $2^{m-n}$ groups of internal data lines;

$2^{m-n}$ groups of data input/output pins;

M (M=1, 2, . . . )-bit input/output configuration memory device mode setting means for accessing said memory section by higher n bits of said m-bit internal address and for selecting one group of said $2^{m-n}$ groups of internal data lines by lower (m–n) bits of said m-bit internal address to connect said selected group of internal data lines to one group of said $2^{m-n}$ groups of data input/output pins; and M×$2^{m-n}$-bit input/output configuration memory device mode setting means for accessing said memory section by lower n bits of said m-bit internal address and for connecting said $2^{m-n}$ groups of internal data lines to said $2^{m-n}$ groups of data input/output pins.

10. A synchronous semiconductor device comprising:

an internal address generating means for generating an m (m=2, 3, . . . )-bit internal address which is successively changed;

a memory section accessed by n (n<m) bits and having $2^{m-n}$ groups of internal data lines;

$2^{m-n}$ groups of data input/output pins;

M (M=1, 2, . . . )-bit input/output configuration memory device mode setting means for accessing said memory section by lower n bits of said m-bit internal address and for selecting one group of said $2^{m-n}$ groups of internal data lines by higher (m–n) bits of said m-bit internal address to connect said selected group of internal data lines to one group of said $2^{m-n}$ groups of data input/output pins; and M×$2^{m-n}$-bit input/output configuration memory device mode setting means for accessing said memory section by higher n bits of said m-bit internal address and for connecting said $2^{m-n}$ groups of internal data lines to said $2^{m-n}$ groups of data input/output pins.

11. A synchronous semiconductor memory device comprising:

an external address latch circuit for receiving a latch signal to latch an m-bit external address;

a burst counter, connected to said external address latch circuit, for receiving a synchronization clock signal to generate an m-bit internal address based upon said external address;

a memory section accessed by n (n<m) bits and having $2^{m-n}$ groups of internal data lines;

$2^{m-n}$ groups of data input/output pins;

an input/output selection means, connected between said $2^{m-n}$ groups of internal data lines and said $2^{m-n}$ groups of data input/output pins, for selecting one group of said $2^{m-n}$ groups of internal data lines for one of said $2^{m-n}$ groups of data input/output pins in an M (M=1, 2, ...)-bit input/output configuration memory device mode and for connecting said $2^{m-n}$ groups of internal data lines to said $2^{m-n}$ groups of data input/output pins in an M×$2^{m-n}$-bit input/output configuration memory device mode;

M (M =1, 2, ...)-bit input/output configuration memory device mode setting means for accessing said memory section by n bits of said m-bit internal address having smaller transition frequencies and for activating said input/output selection means by supplying (m–n) bits of said m-bit internal address having larger transition frequencies; and M×$2^{m-n}$-bit input/output configuration memory device mode setting means for accessing said memory section by n bits of said m-bit internal address having larger transition frequencies and for deactivating said input/output selection means to connect said $2^{m-n}$ groups of internal data lines to said $2^{m-n}$ groups of data input/output pins.

12. A device as set forth in claim 10, wherein said burst counter receives a synchronization clock signal to change said m-bit internal address by $2^{n-1}$ (N=2, 3, ...), said n bits of said m-bit internal address having smaller transition frequencies being higher n bits of said m-bit internal address and the least significant bits to tile N-th least significant bits thereof, said (m–n) bits of said m-bit internal address having larger transition frequencies being lower (m–n) bits of said m-bit internal address except for the least significant bits to the N-th least significant bits thereof, said n bits of said m-bit internal address having larger transition frequencies being lower n bits of said m-bit internal address.

13. A synchronous semiconductor memory device comprising:

an internal address generating means for generating an m-bit internal address in response to a synchronization clock signal;

a memory section having $2^k$ groups of internal data lines, said memory section being capable of operating an M-bit input/output configuration memory device mode and an M×$2^k$ (k=1, 2, ...)-bit input/output configuration memory device mode, said $2^k$ groups of internal data lines selected by k bits of said m-bit internal address which bits are changed at a high frequency in response to said synchronization clock signal under said M-bit input/output configuration memory mode being equivalent to said $2^k$ groups of internal data lines under said M×$2^k$-bit input/output configuration memory mode.

* * * * *